United States Patent
Li et al.

(10) Patent No.: US 8,930,800 B2
(45) Date of Patent: Jan. 6, 2015

(54) METHOD AND APPARATUS OF TRIPLE-DECODING FOR IEEE 802.11P PHYSICAL LAYER MECHANISM

(75) Inventors: Zheng Li, Pittsburgh, PA (US); Fan Bai, Ann Arbor, MI (US); Vijayakumar Bhagavatula, Pittsburgh, PA (US)

(73) Assignees: GM Global Technology Operations LLC, Detroit, MI (US); Carnegie Mellon University, Pittsburgh, PA (US)

( * ) Notice: Subject to any disclaimer, the term of this patent is extended or adjusted under 35 U.S.C. 154(b) by 15 days.

(21) Appl. No.: 13/585,656

(22) Filed: Aug. 14, 2012

(65) Prior Publication Data
US 2014/0053047 A1 Feb. 20, 2014

(51) Int. Cl.
*H03M 13/00* (2006.01)
*H03M 13/23* (2006.01)
*H04B 7/08* (2006.01)

(52) U.S. Cl.
CPC .............. *H03M 13/23* (2013.01); *H04B 7/0851* (2013.01)
USPC ........... 714/786; 714/755; 714/776; 375/347; 375/316; 375/219

(58) Field of Classification Search
CPC . H04L 25/03891; H04L 1/005; H04L 1/0057; H04L 1/0059; H04L 1/0065; H04L 1/0086; H04L 1/0618; H04L 1/1819; H04L 2025/03414; H04L 2025/03611; H04B 17/0075; H04B 7/0851; H03M 13/23
USPC .......... 714/776, E11.001, E11.032, 786, 755; 375/260, 341, 219, 295, 299, 316, 324, 375/326, 329, 346, 347; 329/304, 307
See application file for complete search history.

(56) References Cited

U.S. PATENT DOCUMENTS

| | | | | |
|---|---|---|---|---|
| 6,434,187 B1* | 8/2002 | Beard et al. | ................... | 375/219 |
| 2003/0188252 A1* | 10/2003 | Kim et al. | ..................... | 714/779 |
| 2008/0298224 A1* | 12/2008 | Pi et al. | ......................... | 370/204 |
| 2009/0125793 A1* | 5/2009 | Kishigami et al. | ............ | 714/794 |
| 2009/0126023 A1* | 5/2009 | Yun et al. | ......................... | 726/25 |
| 2010/0223521 A1* | 9/2010 | Kim et al. | ..................... | 714/748 |
| 2011/0280325 A1* | 11/2011 | Fernandez et al. | ............ | 375/260 |
| 2013/0259017 A1* | 10/2013 | Zhang et al. | .................. | 370/338 |

OTHER PUBLICATIONS

Fernandez, Joseph A. "Performance of the 802.11p Physical Layer in Vehicle-to Vehicle Environments" IEEE Transactions on Vehicular Technology, vol. 61, No. 1, pp. 3-14, Jan. 2012.

(Continued)

*Primary Examiner* — Guy Lamarre
(74) *Attorney, Agent, or Firm* — John A. Miller; Miller IP Group, PLC

(57) ABSTRACT

A method for receiving and storing a packet of symbols. The method decodes the packet of symbols using a first decoding algorithm, and if the first decoding algorithm fails to correctly decode the packet of symbols, then the method decodes the packet of symbols using a second decoding algorithm. If the second decoding algorithm fails to decode the packet of symbols, then a third decoding algorithm is used. The third decoding algorithm can be sub-packet decoding, where a first sub-packet is part of the packet of symbols. If the first sub-packet is decoded successfully, then the method generates a channel estimate using the properly decoded information, and then uses that channel estimate to decode a subsequent sub-packet using the channel estimate, where the second sub-packet is a set of symbols that are a portion of the packet of symbols.

20 Claims, 5 Drawing Sheets

(56) References Cited

OTHER PUBLICATIONS

Cheng, Lin "A Measurement Study of Time-Scaled 802,11a Waveforms over the Mobile-to-Mobile Vehicular Channel at 5.9 GHz" IEEE Communications Magazine, pp. 84-91, May 2008.

Cheng, Lin "Mobile Vehicle-to-Vehicle Narrow-Band Channel Measurement and Charaterization of the 5.9GHz Dedicated Short Range Communication (DSRC) Frequency Band" IEEE Journal on Selected Areas in Communications, vol. 25, No. 6, pp. 1501-1516, Oct. 2007.

Alexander, Paul, "Outdoor Mobile Broadband Access with 802.11" IEEE Communications Magazine, pp. 108-114, Nov. 2007.

Lee, Shih-Kai, "Performance of A Robust Inner Receiver with Frequency Domain LMS Equalizer for DSRC Systems"IWCMC, Vancouver, British Columbia, Canada, pp. 985-990, Jul. 2006.

Cheng, Yong-Hua, "Adaptive Channel Equalizer for Wireless Access in Vehicular Environments" IEEE 6th International Conference on ITS Telecommunications Proceedings, pp. 1102-1105, 2006.

Kalekar, Prajakta S. "Time Series Forecasting using Holt-Winters Exponential Smoothing" Kanwal Rekhi School of Information Technology, pp. 1-13, Dec. 6, 2004.

Oteri, O. "Time and Frequency Equalization in 802.11a/g" IEEE, pp. 698-702, 2003.

Kella, Tideya, "Decision-Directed Channel Estimation for Supporting Higher Terminal Velocities in OFDM Based WLANs" IEEE Globecom, pp. 1306-1310, 2003.

Belotserkovsky, M. "An Equalizer Initialization Algorithm for IEEE802.11A and Hiperlan/2 Receivers" IEEE, pp. 1051-1055, 2002.

\* cited by examiner

METHOD AND APPARATUS OF TRIPLE-DECODING FOR IEEE 802.11P PHYSICAL LAYER MECHANISM

BACKGROUND OF THE INVENTION

1. Field of the Invention

This invention relates generally to a system and method for decoding a received transmission and, more particularly, to a system and method for storing and processing a received packet of symbols to reduce packet error rate (PER) for an orthogonal frequency division multiplexing (OFDM) protocol for a vehicle-to-vehicle (V2V) and vehicle-to-infrastructure (V2I) dedicated short range communications (DSRC) system.

2. Discussion of the Related Art

As vehicles have become more and more technologically advanced, a need has arisen for a reliable vehicle-to-vehicle (V2V) and vehicle-to-infrastructure (V2I) communications system, such as a dedicated short range communications (DSRC) system. By using vehicular networks of this type, vehicles can share traffic flow information, alert other vehicles of hazardous road conditions, help drivers be more aware of neighboring vehicles, etc. In addition, reliable vehicular communications is essential to aid in the operation of autonomously driven vehicles.

In digital communications systems of the type referred to above, the digital data being transmitted are modulated onto a carrier wave to include information symbols that are represented by orthogonal sinusoids that identify the data in the transmitted messages. The various components in the transmitter, the transmission medium and the receiver cause various types of distortions in the transmitted signal. These distortions include signal dispersion or smearing that causes pulses in the received signal to not be well defined. If the distortion is not corrected in the receiver during the demodulation process, data can be lost, resulting in unreliable transmissions. Therefore, processes, known as channel equalization, are performed in the receiver on the received signal to remove the distortions and correct for the effects of the channel.

The IEEE 802.11p communications standard is currently the core communication protocol for vehicular networks. The 802.11 communications standard employs a protocol stack including various layers, such as a physical layer, a medium access control (MAC) layer, etc., that each perform different operations, as is well understood by those skilled in the art. This communications standard encodes the digital data that is to be transmitted in the transmitter and deciphers decoded data when it is received at the receiver. For the physical layer (PHY), the IEEE 802.11p standard uses orthogonal frequency division multiplexing (OFDM), where OFDM is a spectrally efficient multi-carrier modulation scheme. OFDM separates the usable bandwidth, typically 10-20 MHz, into 52 orthogonal sub-channels or subcarriers at different frequencies. Of those 52 subcarrier frequencies, 48 subcarrier frequencies are used for data transmission and four subcarrier frequencies are used for pilot transmission. The pilots are used for center frequency offset tracking, as is well understood by those skilled in the art.

The subcarriers within an OFDM signal are orthogonal to each other in both the time and frequency domains, such that they do not interfere with each other. OFDM employs a cyclic prefix, also known as a guard interval, at the beginning of each symbol. This cyclic prefix maintains subcarrier orthogonality and is used to prevent inter-symbol interference. The cyclic prefix thus helps protect OFDM from multipath effects.

The 802.11p PHY is similar to the 802.11a PHY with two primary differences, namely, the 802.11p standard uses a 10 MHz bandwidth, where the 802.11a standard uses 20 MHz, and the 802.11p standard uses an operating frequency of 5.9 GHz, where the 802.11a standard uses an operating frequency of 5 GHz. When using a binary phase-shift keying (BPSK) modulation scheme with 1/2 coding rate, this yields a data rate of 3 Mb/s.

All of the above described features make the 802.11p standard a good choice for a high data rate communications protocol for an outdoor channel. However, performance of the 802.11p standard over V2V channels is far from optimal. In previous work, the statistical characteristics of the V2V channel were measured, and the feasibility of using different time scaled OFDM waveforms was studied. The primary detriment to performance of the 802.11p standard is the channel's short coherence time. Particularly, because the 802.11p standard does not restrict the length of message packets, a short coherence time is a major concern. Short packets will naturally have better performance, whereas longer packets will suffer as a result of the short coherence time of the channel. Therefore, enhanced channel equalization for the 802.11p standard is needed in an effort to reduce packet error rate (PER). Improving the performance at the physical layer will result in improved performance at all layers.

The IEEE 802.11p PHY is based on the PHY found in the 802.11a standard. This standard was designed for indoor use, and as such performs well for indoor environments. However, outdoor environments feature a more dynamic channel and a longer delay spread in the signal. This leads to the guard interval in the 802.11a standard being too short for outdoor use. Several methods for addressing an excessively long delay spread in the 802.11p standard are known. However, the 802.11p standard has a guard interval that is twice as long as the guard interval in the 802.11a standard. Based on channel measurements, the long delay spread is not a significant problem affecting the 802.11p standard, and therefore, the short coherence time is more important.

Several techniques exist to improve the performance and accuracy of the initial channel estimate in packetized message transmissions. While this type of technology is important for the 802.11a standard, the short coherence time of a V2V channel nullifies any gains realized by a more accurate initial estimation.

For packetized OFDM transmissions, tracking the channel is important. Some work has been done on adaptive channel tracking algorithms for a DSRC system and/or the 802.11 standard. Decision directed channel feedback from data symbols is determined by decoding and demodulating symbols to re-estimate the channel throughout the packet. This method is more complex in that it requires Viterbi decoding and remodulation of OFDM symbols as equalization is taking place. A similar technique has been employed for 802.11a packets that are applied to a vehicular environment. This works in tandem with a time domain equalizer that helps to reduce the effects of multipath and inter-symbol interference. An adaptive technique using vehicle speed, signal-to-noise ratio and packet length has been proposed to aid in tracking the channel using data symbols. A least mean squares (LMS) algorithm has been used in conjunction with pilot data to correct for residual carrier frequency offset and channel conditions throughout the length of the packet.

SUMMARY OF THE INVENTION

In accordance with the teachings of the present invention, a method for decoding symbols in a transmission signal is disclosed. The method decodes the packet of symbols using a first decoding algorithm, and if the first decoding algorithm fails to correctly decode the packet of symbols, then the method decodes the packet of symbols using a second decoding algorithm. If the second decoding algorithm fails to decode the packet of symbols, then the method uses a third decoding algorithm. The third decoding algorithm can be sub-packet decoding that decodes a first sub-packet that is part of the packet of symbols. If the first sub-packet is decoded successfully, then the method generates a channel estimate using the properly decoded information, and uses that channel estimate to decode a second sub-packet using the channel estimate, where the second sub-packet is a set of symbols that are a portion of the packet of symbols.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for providing dynamic channel equalization in a V2V and V2I communications system that employs an OFDM protocol is merely exemplary in nature, and is in no way intended to limit the invention or its applications or uses. For example, the channel equalization techniques discussed below have particular application for vehicle communications networks employing the IEEE 802.11p communications standard. However, as will be appreciated by those skilled in the art, these channel equalization techniques may have application for other protocols and other communications standards.

Figure 1:
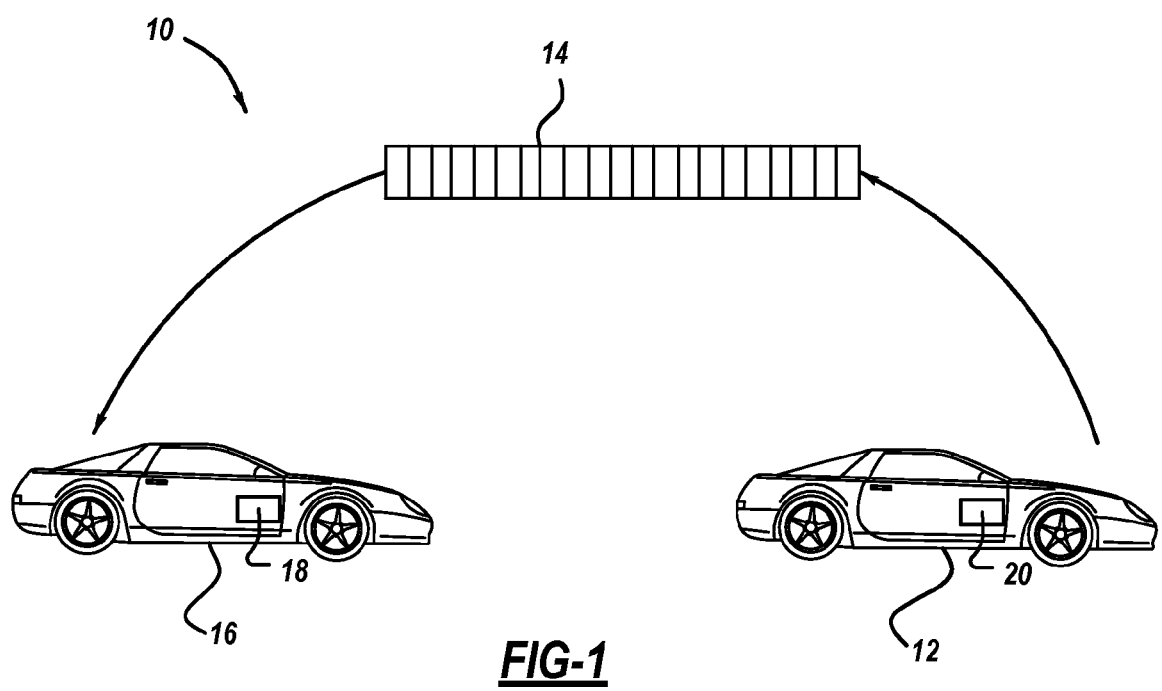
FIG. 1 is an illustration of a vehicle transmitting messages to another vehicle.

FIG. 1 is a diagram of a vehicular communications network 10 showing a vehicle 12 in the network 10 using a transmitter 20 to transmit a message 14 that is received by a receiver 18 in another vehicle 16 in the network 10 using the IEEE 802.11p communications standard discussed herein.

To test different estimation and equalization schemes for data transmission using the 802.11p communications standard, 802.11p waveforms can be recorded over an actual V2V channel. In these real scenarios, one vehicle can act as the transmitter and another vehicle as the receiver. The transmitter vehicle can be equipped with a digital signal generator (DSG) that produces the transmitted waveform. The receiver vehicle can be equipped with a vector signal analyzer (VSA) that saves and demodulates the sampled waveform. The receiver can processes time-sampled in-phase and quadrature phase (I&Q) packet waveforms, and perform time synchronization, frequency offset correction, initial channel estimation, demodulation and equalization.

The current technique for estimating and equalizing an 802.11a waveform, which has a similar structure to an 802.11p waveform, is to use a least-squares (LS) method for channel estimation. It should be noted that this method is identical to the maximum likelihood (ML) estimation of the channel.

Figure 2:
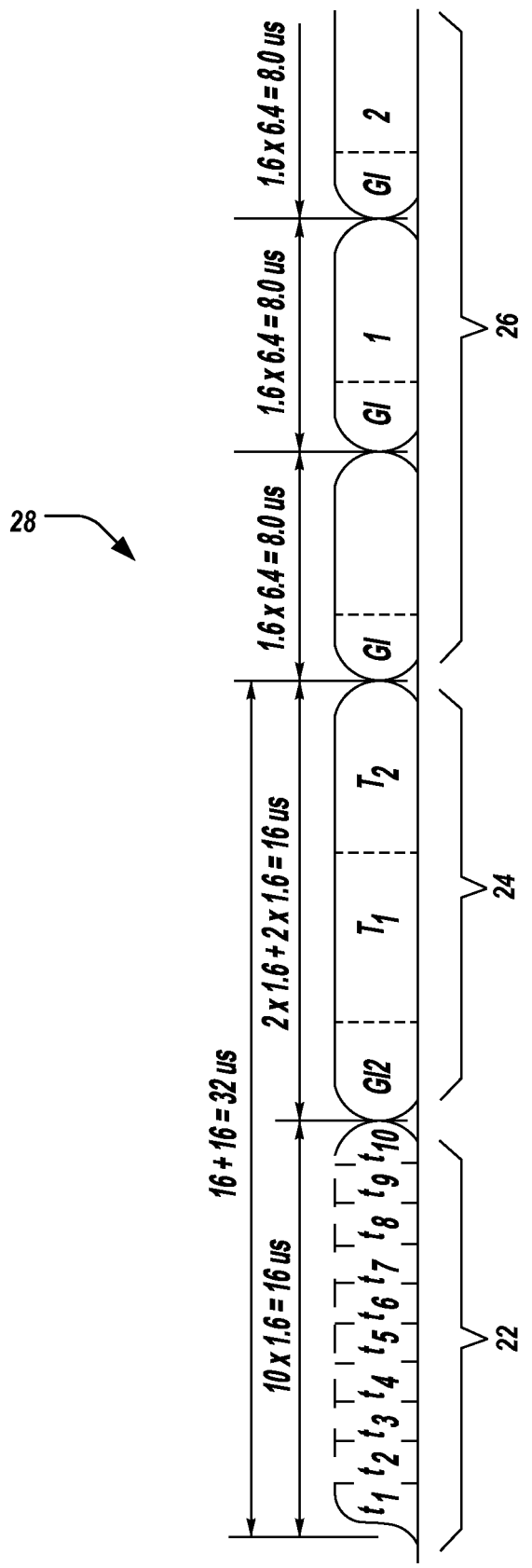
FIG. 2 is a packet structure for an IEEE 802.11p communications standard.

A packet structure 20 for a message using the 802.11p standard is shown in FIG. 2. The first ten short symbols 22 of the structure 20 are used for training synchronization, the two symbols 24 that follow the symbols 22, namely, $T_1$ and $T_2$, are used for estimating the channel, and the remaining part of the structure 20 is data 26 to be demodulated and decoded.

For the LS estimation process, first the time-domain symbols $T_1[n]$ and $T_2[n]$ are extracted from the received signal, and demodulated using an N-point discrete Fourier transform (DFT) as:

$$Y_1(k) = \sum_{n=0}^{N-1} T_1[n] e^{-\frac{2\pi j}{N} kn}, \quad (1)$$

$$Y_2(k) = \sum_{n=0}^{N-1} T_2[n] e^{-\frac{2\pi j}{N} kn}, \quad (2)$$

where $j=\sqrt{-1}$.

Because the bits in the training symbols $T_1$ and $T_2$ are known by the receiver, the LS estimation process for both of the transmitted time-domain symbols $T_1[n]$ and $T_2[n]$ may be formulated as:

$$H_1 = \frac{Y_1}{X_1}, \quad (3)$$

$$H_2 = \frac{Y_2}{X_2}, \quad (4)$$

where $H_1$ and $H_2$ are channel frequency response functions for the channel estimations, $Y_1$ and $Y_2$ are the DFT values in vector form from Equations (1) and (2), and $X_1$ and $X_2$ are the known training vector values as defined by the 802.11p standard. Note that the divisions in Equations (3) and (4) are element-wise.

A final channel estimation frequency response H is computed as:

$$H = \frac{(H_1 + H_2)}{2}. \quad (5)$$

The data 26 in the packet structure 20 is equalized using the channel estimation frequency response H. For a given received symbol $S_R[n]$, the symbol is first demodulated using the DFT as:

$$S_R(k) = \sum_{n=0}^{N-1} S_R[n] e^{-\frac{2\pi j}{N} kn}. \quad (6)$$

The received DFT vector is equalized using element-wise multiplication, such that the estimate $\hat{S}_T$ of the transmitted symbol $S_T$ is:

$$\hat{S}_T = S_R \cdot {}^* H^{-1}. \quad (7)$$

Note that this is a simple, one-tap equalizer for each sub-carrier and that the inversion of H is element-wise. This is repeated for all of the symbols in the packet. It is clear that if the channel changes significantly over the duration of a packet, the channel estimation frequency response H no longer accurately represents the channel, and equalization will actually begin to damage the received signal rather than correct it. Thus, an efficient technique for tracking the channel is crucial.

Spectral Temporal Averaging (STA) Estimation

A spectral temporal averaging (STA) estimation technique for this method can be formalized as follows. First, the initial channel estimate is obtained from the training preamble as in Equation (5). This initial estimate is applied to the first symbol in the packet. Once this symbol is demodulated, a channel estimation frequency response $H_i$ is formed as:

$$H_i = Y_i/X_i, \qquad (8)$$

where, $Y_i$ is the received constellation pattern at symbol i, $X_i$ is the demodulated symbol values at symbol i, and $H_i$ is the channel estimation frequency response formed at a given symbol. Note that the vector division here is element-wise.

The channel estimation frequency response $H_i$ is first averaged in frequency. The average is constructed as a simple moving average, such that the estimate at the subcarrier frequency λ is formed as:

$$H_{update,\lambda} = \frac{H_{i,\lambda-\beta} + \ldots + H_{i,\lambda-1} + H_\lambda + H_{i,\lambda+1} + \ldots + H_{i,\lambda+\beta}}{2\beta+1}, \qquad (9)$$

where β is a parameter that determines the number of terms included in the average.

It will be clear to those skilled in the art that other methods of frequency averaging could be used, and that Equation (9) is simply a special case of:

$$H_{update,\lambda} = \frac{1}{2\beta+1} \sum_{k=-\beta}^{\beta} W_k H_{i,\lambda+k}, \qquad (10)$$

where $W_k$ is the weight applied to the $k^{th}$ term in the sum.

After calculating the channel estimation frequency response ($H_{update,\lambda}$) for all 52 subcarriers, the new channel estimation frequency response $H_{update}$ is updated as:

$$H_{STA,t} = \left(1 - \frac{1}{\alpha}\right) H_{STA,t-1} + \frac{1}{\alpha}(H_{update}), \qquad (11)$$

where α is a moving average parameter in time. Note that the channel estimation frequency response $H_{STA,0}$ is the initial channel estimated obtained from the preamble estimation. The channel estimation frequency response $H_{STA,t}$ is then applied to the next symbol's equalization, and the process is repeated until the packet is completely demodulated.

Details of STA estimation can be found in U.S. Patent Application Publication No. US 2011/0280325 A1, filed May 12, 2010, titled "Spectral-temporal Averaging for IEEE 802.11p Dynamic Channel Equalization," assigned to the assignee of this application and herein incorporated by reference.

Holt-Winters Algorithm

The STA estimation is the first order of a Weighted Moving Average (WMA), and can be enhanced by a second order WMA known as the "Holt-Winters" algorithm.

The enhanced STA estimation based on the Holt-Winters algorithm can be described as follows.

$$H_{STA,t} = \left(1 - \frac{1}{\alpha}\right)(H_{STA,t-1} + b_{t-1}) + \frac{1}{\alpha}(H_{update}), \qquad (12)$$

where, $$b_t = \left(1 - \frac{1}{\rho}\right)(b_{t-1}) + \frac{1}{\rho}(H_{STA,t} - H_{STA,t-1}), \qquad (13)$$

$$b_0 = H_{update} - H, \; H_{STA,0} = H, \qquad (14)$$

and ρ is a moving average parameter in time.

Comparing the STA estimation of Equation (10) to the Holt-Winters algorithm of Equation (12), it can be seen that Holts-Winters algorithm has an additional item $b_{t-1}$ for further refinement.

Sub-Packet Decoding

PER performance can be improved when the receiver knows a few distributed channels in each packet, i.e., when partial channel knowledge is available at the receiver. For example, for a packet of 184 OFDM data symbols and assuming the receiver knows a few equally separated channels in each packet, such as the 1-st, 24-th, 47-th, 70-th, 93-th, 116-th, 139-th, and 162-th channels, then this would provide partial channel knowledge (8 channels) for the receiver to decode. The eight equal separate channels are separated by 23 OFDM data symbols and thus span the entire packet of 184 OFDM data symbols (8×23=184). Note that the PER is always lower with more partial channel knowledge (knowing more channels) at the receiver. Knowing all of the channels is an extreme case (entire channel knowledge) which is impractical.

Although all of the examples given are for dividing the packet into equal segments, as that is most convenient for processing, that is not a requirement for creating the sub-packets. For example, a packet could be divided into a first sub-packet of 32 symbols followed by two sub-packet of 16 symbols, followed by a dozen sub-packets with 10 symbols each.

IEEE 802.11p does not support the simplest way of knowing a few distributed channels, which would include inserting more training symbols in the middle of each packet. In order to obtain partial channel knowledge in a standard compliant way, a sub-packet decoding processing is proposed. Sub-packet decoding is based on the principle of dividing a long packet into several shorter sub-packets and decoding the shorter sub-packets serially. In this way, when the previous sub-packet is decoded correctly, channel knowledge of the sub-packet is obtained and used to estimate the channels in the following sub-packet.

Figure 3:
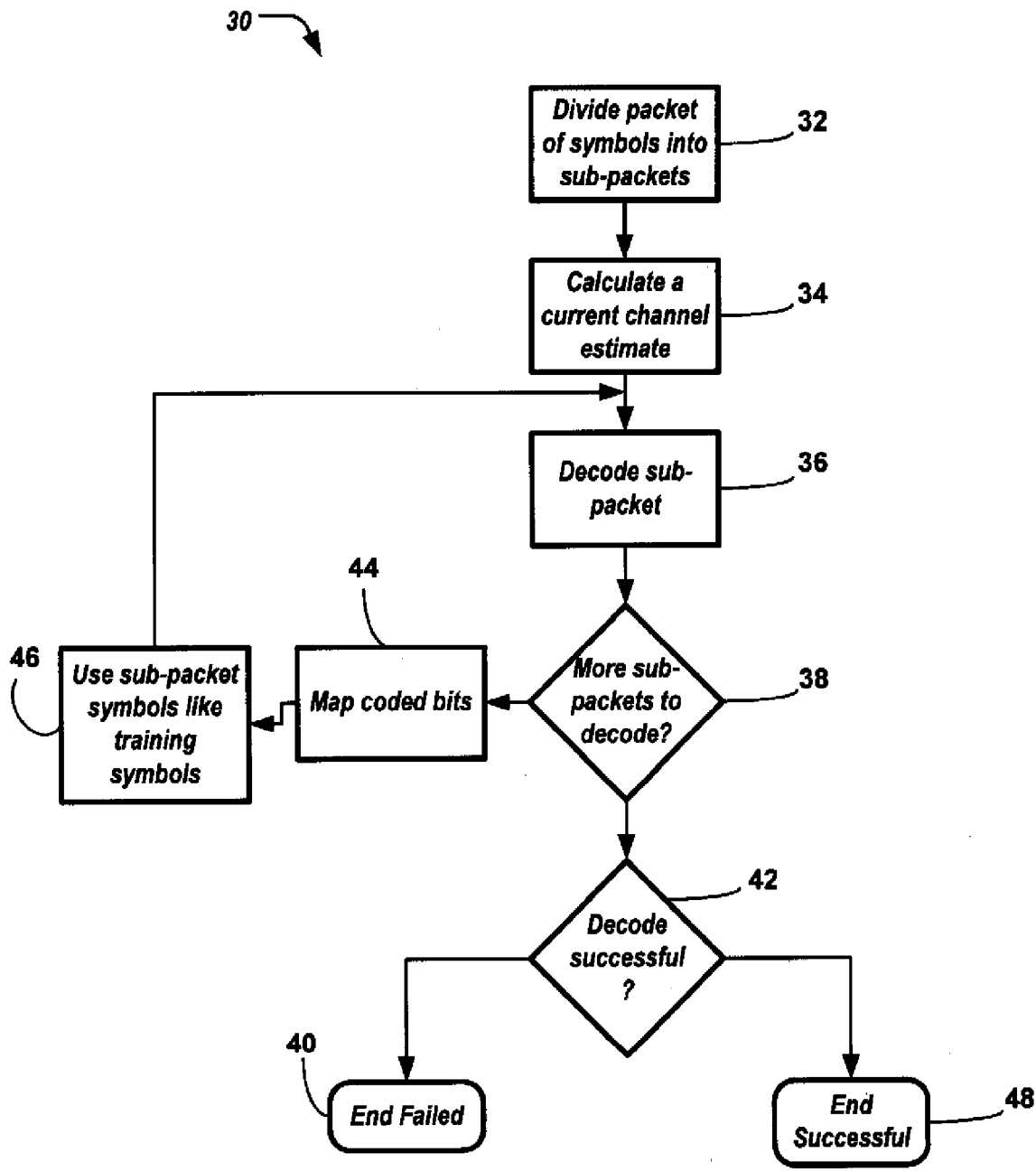
FIG. 3 is an exemplary flow chart diagram of sub-packet decoding.

FIG. 3 is an exemplary flow chart diagram 30 that shows sub-packet decoding of a packet of symbols. The algorithm starts at box 32 where the packet of symbols is divided into sub-packets, for example, a packet that has 184 OFDM symbols can be divided into 8 sub-packets, where each sub-packet has 23 OFDM symbols. After the sub-packets have been created, the algorithm, at box 34, calculates a current channel estimate using the STA channel estimation, Equation (5), with the training symbols that immediately preceded the packet. The algorithm then uses the current channel estimation to decode the $1^{st}$ sub-packet at box 36, and then proceeds to decision diamond 38 with the decoded information bits.

At decision diamond 38, the algorithm determines if there are more sub-packets to decode. If there are more sub-packets to decode, then the algorithm proceeds to box 44 where the algorithm reconstructs the transmitted symbols in the previous sub-packet, that is, coding the decoded information bits as coded bits and taking those coded bits and mapping them to modulated symbols (e.g., BPSK modulation). In this way, the symbols for the sub-packet are reconstructed, and they can be used like training symbols at box 46 to calculate a new current channel estimation using Equation (8). The algorithm sends the next sub-packet to the box 36 as the current sub-packet along with the new current channel estimate. At the box 36, the algorithm processes the current sub-packet with the current channel estimate as it did for the $1^{st}$ sub-packet. If there are no more sub-packets to decode at the decision diamond 38, then the algorithm goes to decision diamond 42 where a CRC check is used to see if the decoding was successful. If the decoding was successful, then the algorithm ends at box 48, having successfully decoded the packet. If the decoding failed, then the algorithm ends at box 40 having failed to decode the packet.

It is noted that when decoding a sub-packet it cannot be determined whether that sub-packet is decoded correctly. The process of decoding the sub-packets continues one-by-one until all of the sub-packets are decoded, then the CRC check will tell if the whole packet was decoded correctly or not. During the sub-packet decoding, the decoded information bits from the previous sub-packet are used to help decode the next sub-packet, even though it is not known if the previous sub-packet was decoded correctly. The decoded information bits are just used whether correct or not to reconstruct the transmitted symbols.

Also note that dividing a packet into 8 sub-packets is only one example. Other ways of dividing the packet into sub-packets are also valid. The divisions can be based on the length of the packet, how many channels the receiver needs to know and the computational complexity.

The performance of sub-packet decoding mainly depends on two factors. First, the error probability of decoding any one sub-packet within a packet, which will be significantly lower because the sub-packet length is significantly shorter than the whole packet. Second, the accumulation of error probability of decoding each sub-packet of the packet. Within one packet, if the decoding of any sub-packet is incorrect, then the decoding of the whole packet will be incorrect.

Triple Decoding

Since separately using the sub-packet decoding is not enough to achieve good PER performance, a triple decoding scheme is introduced to achieve low PER.

Conventional receivers only perform decoding procedures once. After the decoding, the receiver will use a cyclic redundancy check (CRC) to determine if retransmission of the data is necessary. If the CRC is passed, then the receiver knows the packet was successfully decoded. If not, the receiver will automatically send feedback information to the transmitter to request a retransmission of the erroneous packet.

The triple decoding can perform the decoding procedure multiple times. The main principle of the triple decoding is that when the CRC check fails for the first time, the receiver will not request retransmission immediately, as in conventional receiving processing, but will try to decode the data again using a different decoding method. The next decoding process will only be performed on the erroneous packets that did not pass the CRC check in the previous decoding process. The next decoding process can recover part of the erroneous packets after the previous decoding process has failed. In one embodiment, three different decoding methods are used, but the next decoding method is not tried until the current decoding method has been attempted with different parameters. The CRC check needs to fail a certain number times (e.g., 3 times) for the current decoding method running with different parameters before the next of the three decoding methods will be tried. Only after each of the three decoding methods fails a certain number of times (e.g., 3 times) will the receiver request retransmission.

In one embodiment, the three different decoding processes are STA decoding, Holt-Winters decoding, and sub-packet decoding. The first decoding method uses STA estimation for decoding the whole packet and is denoted "STA decoding." The second decoding method uses the enhanced STA estimation based on the Holt-Winters algorithm and is for decoding the whole packet, and is denoted "HW decoding." The third decoding method is the procedure described earlier, and is denoted "sub-packet decoding."

The procedure of the triple decoding process discussed above can be described using pseudo code:

```
for each received packet
    perform STA decoding
    if CRC check passed
        Done
    else
        perform HW decoding
        if CRC check passed
            Done
        else
            perform sub-packet decoding
            if CRC check passed
                Done
            else
                Request Retransmission
            end
        end
    end
end
```

Note that a key requirement in the triple decoding scheme is that the receiver must store the received symbols for further decoding. In conventional receivers with only a single decoding, the receiver does not store the received symbols.

Figure 4:
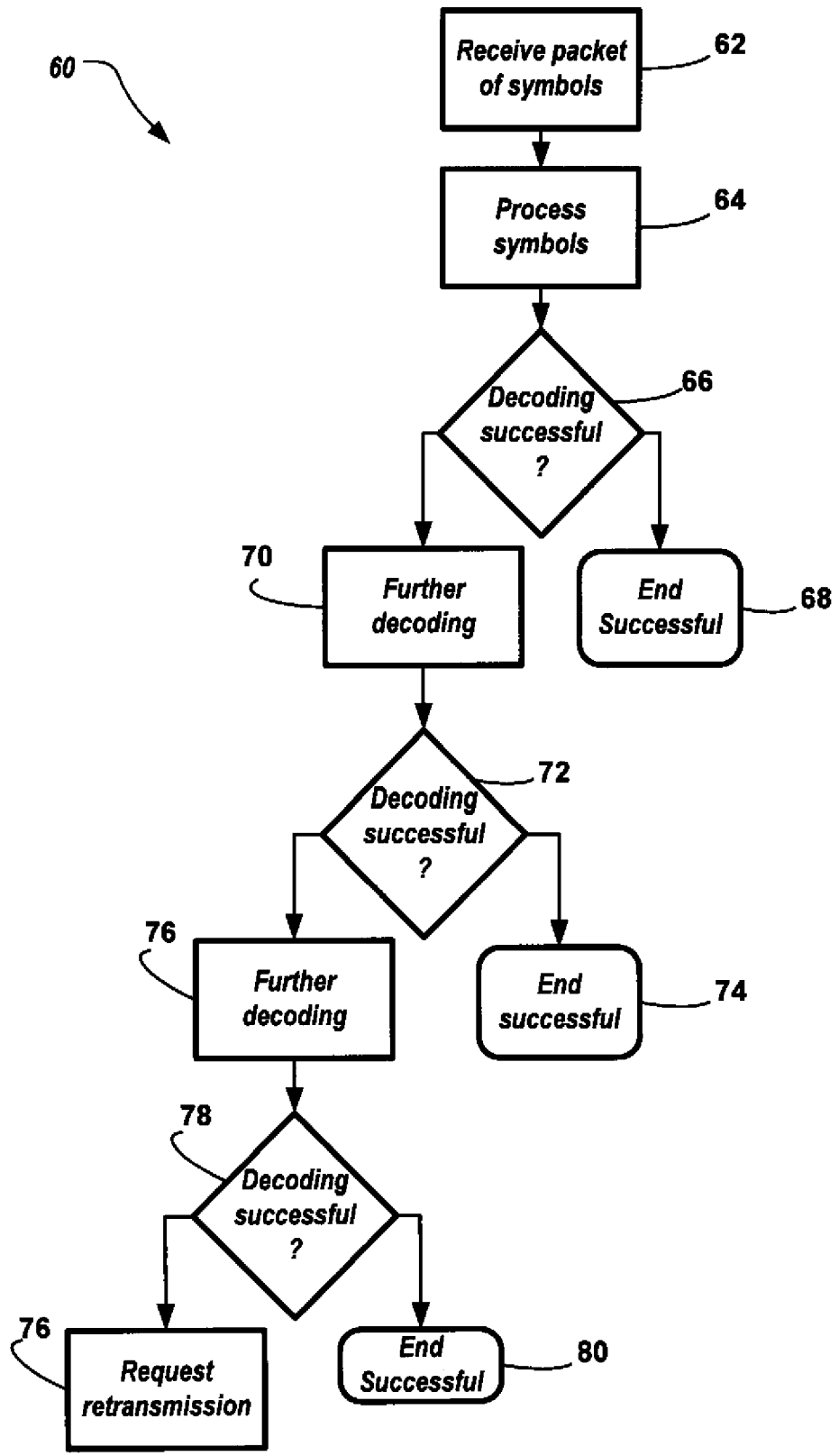
FIG. 4 is an exemplary flow chart diagram of a triple decoding procedure.

FIG. 4 is an exemplary flow chart diagram 60 showing an algorithm for triple decoding received symbols. The algorithm starts when box 62 receives a packet of symbols. Next, the symbols are processed by an implementation of the STA decoding at box 64, and then a CRC check is performed at decision diamond 66. If the packet was decoded successfully, the algorithm moves to box 68 and ends, having successfully decoded the packet. If the packet failed to decode properly, the algorithm continues to box 70 for further decoding. At the box 70, the algorithm decodes the symbols with an implementation of the HW decoding, and another CRC check is performed at decision diamond 72 to determine if the symbols have been successfully decoded. If the packet was decoded successfully, the algorithm moves to box 74 and ends having successfully decoded the symbols. If the HW decoding failed to properly decode the packet, then the algorithm continues to box 76 to try again to recover the packet. At the box 76, the symbols are processed by an implementation of the sub-packet decoding, and another CRC check is performed at decision diamond 78. If the packet was successfully decoded, then the algorithm moves to box 80 and ends having successfully decoded the packet. If the packet failed to be decoded successfully, then the algorithm proceeds to box 82 where a request for retransmission is made.

Multi-Implementation by Changing Decoding Parameters

Each of the three decoding methods discussed above have parameters that can be adjusted.

In STA decoding, the averaging parameters $\alpha$ and $\beta$ can be changed. In the triple decoding procedure, setting $\alpha=2$ and β=2 was found to produce the best results for one particular implementation compared to other options. However, other settings, such as α=2 and β=1, could be used as well.

Similarly, in HW decoding, the averaging parameters α, β and ρ can be adjusted. In the triple decoding procedure discussed above, α=2, β=2 and ρ=2 were found to produce the best for one particular implementation compared to other options. Other settings, such as α=2, β=1 and ρ=2, could be used as well.

Similarly, in sub-packet decoding, the sub-packet division can be changed. In the triple decoding procedure discussed above, 8 sub-packets with 23 OFDM symbols in each (8×23) was used because experimentation showed this division is the best for one particular implementation compared to other options. Other divisions, such as 23 sub-packets with 8 OFDM symbols in each (23×8), could be used as well.

In the triple decoding scheme discussed above each decoding method was implemented only once for a total of three implementations. Alternatively, each decoding method could be implemented more than one time with different parameters. For example, for STA decoding, a first STA decoding implementation could use α=2 and β=2, and then after the CRC check, the remaining erroneous packets could go through a second STA decoding implementation with α=2 and β=1. Also, for sub-packet decoding, the first sub-packet decoding implementation could be with sub-packet division 8×23, and the remaining erroneous packets could go through a second sub-packet decoding implementation with sub-packet division 23×8. Each implementation would only be performed on the erroneous packets that failed to pass the CRC check in the previous implementation. After each implementation, part of the remaining erroneous packets after the previous implementation could be recovered.

By changing different parameters for each of the three decoding methods discussed previously, the processing could in theory iterate over the erroneous packets an infinite number times. However, it will eventually become undesirable to continue trying additional decoding method, for example, the computational complexity will increase with each iteration and the improvement of PER performance will diminish with each successive iteration, so at some point it becomes undesirable to continue.

Figure 5:
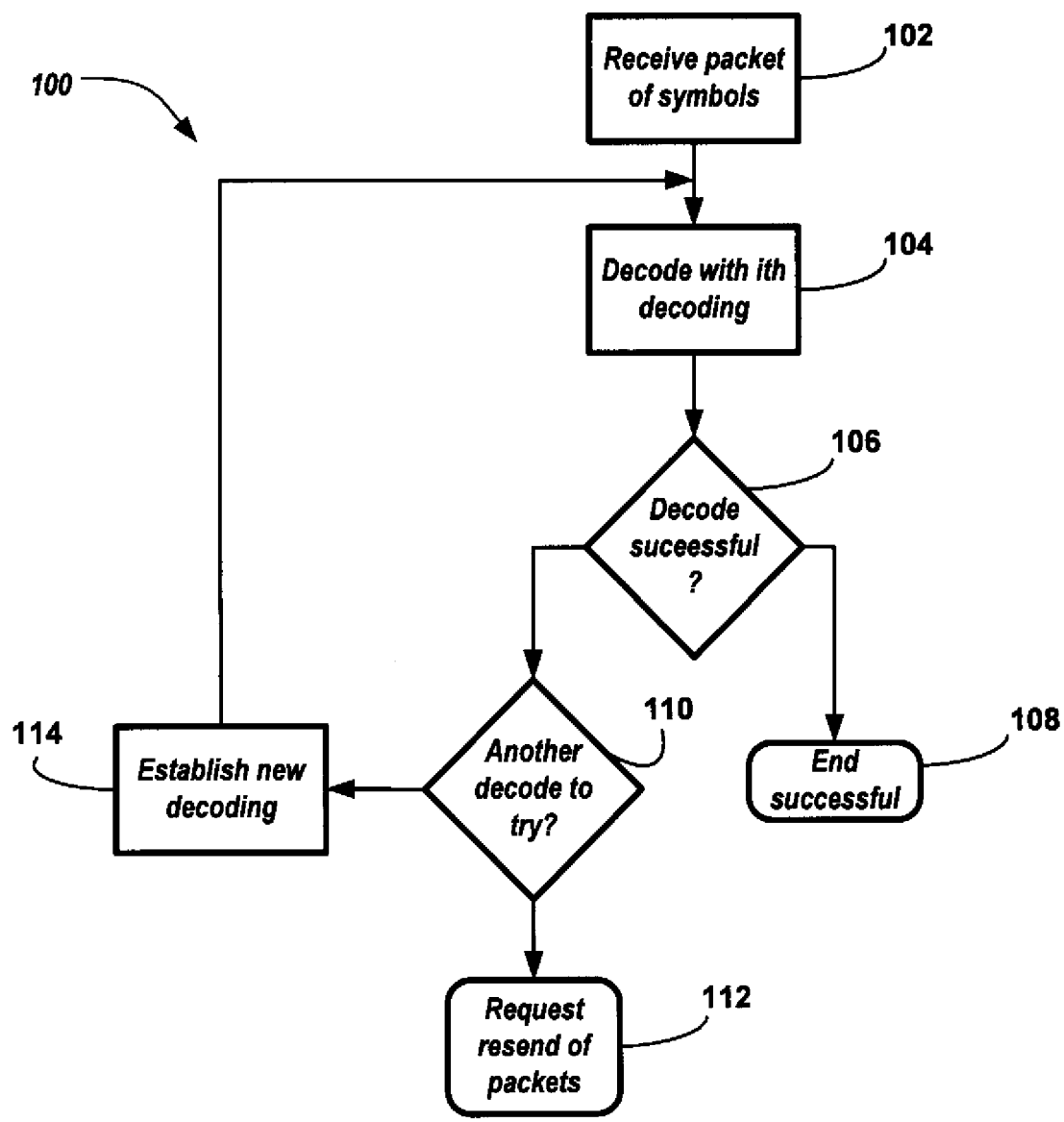
FIG. 5 is an exemplary process flow for multi-implementation processing.

FIG. 5 is an exemplary flow chart diagram 100 showing a multi-implementation process for decoding a received packet of symbols. The process starts when box 102 receives a packet of symbols. The process sets a first iteration (i=1) decoding implementation with a specific decoding algorithm and decoding parameters. At box 104, the symbols are decoded with the $i^{th}$ decoding implementation. Once the process at the box 104 is done decoding, then the CRC check is performed at decision diamond 106 to determine if the packet was decoded successfully. If the packet was decoded successfully, then the process is done at box 108 having successfully decoded the packet of symbols. If the packet failed to decode properly, then the process continues to decision diamond 110. At the decision diamond 110, the process decides if there is another decoding implementation to try. If there is another decoding implementation to try, then the process goes to box 114 to establish a new (i=i+1) decoding implementation. The new decoding implementation involves selecting a decoding algorithm and decoding parameters. Then, the process goes to the box 104 to decode the packet using the $i^{th}$ decoding implementation. If there are no more decoding implementations to try, then the process goes to box 112 and requests the packet be resent.

According to experiments, implementing the three decoding methods multiple times with different parameters can achieve good PER performance with moderate increases in computational complexity. One configuration found to improve PER performance used 8 groupings of decoding methods and parameters, as listed in Table 1 that follows.

TABLE 1

Parameters for Multi-Implementation

| Decoding Methods | Parameters Chosen |
| --- | --- |
| STA Decoding (1) | α = 2 and β = 2 |
| STA Decoding (2) | α = 2 and β = 1 |
| STA Decoding (3) | α = 1 and β = 2 |
| HW Decoding (4) | α = 2, β = 2 and ρ = 2 |
| HW Decoding (5) | α = 2, β = 1 and ρ = 2 |
| HW Decoding (6) | α = 2, β = 3 and ρ = 2 |
| Sub-packet Decoding (7) | 8 × 23 |
| Sub-packet Decoding (8) | 23 × 8 |

The decoding schemes discussed above were tested on real packets from an actual V2V channel. According to the IEEE 802.11p standard, 1/2 rate convolutional coding was used as the channel coding and BPSK modulation in the tests which provides a transmission rate of 3 Mbps.

Two environments were tested, namely, highway and rural. Table 2 below lists the overall PER results obtained from these tests. Table 2 shows that triple decoding out-performed STA Decoding, and triple decoding (8-times) can further reduce PER.

TABLE 2

PER results for different schemes

| Scheme | Highway | Rural |
| --- | --- | --- |
| STA Decoding | 17.6% | 17.4% |
| Triple Decoding (3-time) | 15.2% | 15.1% |
| Triple Decoding (8-time) | 13.7% | 13.6% |

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for decoding symbols in a transmission signal, said method comprising:
 receiving a packet of symbols;
 decoding the packet of symbols using a first decoding algorithm;
 determining that the first decoding algorithm failed to correctly decode the packet of symbols;

decoding the failed packet of symbols using a second decoding algorithm;
determining that the second decoding algorithm also failed to correctly decode the packet of symbols; and
decoding the twice failed packet of symbols using a third decoding algorithm.

2. The method of claim 1 wherein the first, second, or third decoding algorithm uses spectral temporal averaging estimation decoding.

3. The method of claim 1 wherein the first, second, or third decoding algorithm uses sub-packet decoding.

4. The method of claim 3 wherein the sub-packet decoding includes:
decoding one sub-packet into information bits, said one sub-packet being a portion of the packet of symbols;
generating a channel estimate using the information bits; and
decoding another sub-packet using the channel estimate, said another sub-packet being a portion of the packet of symbols that is different than the one sub-packet.

5. The method of claim 1 wherein the first decoding algorithm uses spectral temporal averaging decoding, the second decoding algorithm uses Holt-Winters decoding, and the third decoding algorithm uses sub-packet decoding.

6. The method of claim 1 wherein the transmission signal is an IEEE 802.11p transmission.

7. A method for decoding symbols in a transmission signal, said method comprising:
receiving a packet of symbols;
setting a current decoding algorithm;
decoding the packet of symbols using the current decoding algorithm;
determining if the packet of symbols has been correctly decoded; and
repeating the steps of setting the current decoding algorithm to a different current algorithm, decoding the packet of symbols using the reset current decoding algorithm, and determining if the packet of symbols has been correctly decoded until the packet of symbols is correctly decoded.

8. The method of claim 7 wherein setting the current decoding algorithm includes setting the current decoding algorithm to a spectral temporal averaging decoding algorithm.

9. The method of claim 7 wherein setting the current decoding algorithm includes setting the current decoding algorithm to a sub-packet decoding algorithm.

10. The method of claim 9 wherein the sub-packet decoding algorithm has sub-packets having a consistent size.

11. The method of claim 10 where the sub-packet decoding includes:
decoding one sub-packet into information bits, said one sub-packet being a portion of the packet of symbols;
generating a channel estimate using the information bits; and
decoding another sub-packet using the channel estimate, said another sub-packet being a portion of the packet of symbols that is different than the one sub-packet.

12. The method of claim 7 wherein setting the current decoding algorithm includes:
setting the current decoding algorithm to a spectral temporal averaging decoding algorithm;
repeat setting the current decoding algorithm to a Holt-Winters decoding algorithm; and
repeat setting the current decoding algorithm to a sub-packet decoding algorithm.

13. The method of claim 7 wherein setting the current decoding algorithm includes:
setting the current decoding algorithm to a spectral temporal averaging (STA) decoding with a first STA parameter set;
repeat setting the current decoding algorithm to an STA decoding algorithm with second STA parameter set;
repeat setting the current decoding algorithm to a Holt-Winters (HW) decoding algorithm with first HW parameter set;
repeat setting the current decoding algorithm to a HW decoding algorithm with second HW parameter set;
repeat setting the current decoding algorithm to a sub-packet decoding algorithm with a first sub-packets set; and
repeat setting the current decoding algorithm to a sub-packet decoding algorithm with a second sub-packet set.

14. The method of claim 7 further comprising requesting retransmission of the packet of symbols if the method does not ultimately decode the packet of symbols.

15. A method for decoding symbols in a transmission signal, said method comprising:
receiving a packet of symbols;
decoding one sub-packet into information bits, said one sub-packet being a portion of the packet of symbols;
generating a channel estimate from the information bits; and
decoding another sub-packet using the channel estimate, said another sub-packet being a portion of the packet of symbols that is different than the one sub-packet.

16. The method of claim 15 wherein decoding the sub-packet uses a channel estimate based on training symbols that precede the packet of symbols.

17. The method of claim 15 wherein the another sub-packet is contiguous to the one sub-packet in the packet of symbols.

18. The method of claim 17 wherein the one sub-packet is located at the beginning of the packet of symbols.

19. The method of claim 15 wherein generating the channel estimate uses the information bits as training symbols to calculate the channel estimate.

20. The method of claim 15 where the transmission signal is an IEEE 802.11p signal.

* * * * *